United States Patent
Burns

[11] 3,982,214
[45] Sept. 21, 1976

[54] 180° PHASE SHIFTING APPARATUS
[75] Inventor: Richard W. Burns, Orange, Calif.
[73] Assignee: Hughes Aircraft Company, Culver City, Calif.
[22] Filed: Oct. 23, 1975
[21] Appl. No.: 625,344

[52] U.S. Cl.............................. 333/31 R; 333/7 D; 333/97 S; 328/56; 307/262
[51] Int. Cl.² .......................................... H03H 7/30
[58] Field of Search............ 333/29, 31 R, 7 D, 7 R, 333/97 S; 307/262, 317, 259; 328/55, 56

[56] References Cited
UNITED STATES PATENTS

| | | | |
|---|---|---|---|
| 3,295,138 | 12/1966 | Nelson | 333/31 R |
| 3,400,405 | 9/1968 | Patterson | 333/7 D X |
| 3,568,097 | 3/1971 | Hyltin | 333/31 |
| 3,916,349 | 10/1975 | Ranghelli et al. | 333/7 D |
| 3,931,599 | 1/1976 | Salzberg | 333/31 R |

*Primary Examiner*—Saxfield Chatmon, Jr.
*Attorney, Agent, or Firm*—Robert H. Himes; W. H. MacAllister

[57] ABSTRACT

The use of electronically variable phase shifters is required in phased array radar systems. Diode phase shifters are particularly well suited for use in phased array radar systems because they have size and weight advantage over other types of phase shifting components such as ferrite devices and traveling wave tubes and, in addition, offer the potential of cost reductions through the application of batch processing techniques. In accordance with the present invention, a 180° phase bit is provided by two series diodes with three transmission line segments shunting each junction to ground through a common shunt diode. Operation is effected by the simultaneous forward or reverse biasing of the series and shunt diodes, thereby introducing a 180° phase difference in a signal transmittal therethrough.

10 Claims, 4 Drawing Figures

180 DEGREE PHASE SHIFTING APPARATUS

BACKGROUND OF THE INVENTION

Several types of diode phase shifters have been devised such as switched line, hybrid coupled, loaded line and three element "π" or "T" circuits. The switched line circuit includes a pair of single-pole, double-throw switches for switching one of two lengths of transmission line into a circuit. In general, this circuit requires four diodes. Phase shift is obtained by switching between one line used as a reference path and a second line which provides a delay path. The hybrid coupled circuit includes a 3-decible hybrid with a pair of balanced diode switches connected to identical split arms of the hybrid. The hybrid coupled bit is used extensively because it achieves larger phase shifts while still using only two diodes. The loaded line circuit includes a number of pairs of switched susceptances spaced at one-quarter wavelength intervals along a transmission line. Phase shift is obtained as the susceptances are changed from an inductive to a capacitive state. Phase shift for this circuit is limited to about 45° for a pair of diodes. Lastly, the π-circuit consists of two shunt elements and one series element. Phase shift is obtained by changing the circuit elements between a low-pass and a high-pass condition. Phase shifts of the order of 90° can be obtained with this circuit. Three diodes are required for the "π" circuit and the "T" circuit which is a dual of the "π" circuit.

SUMMARY OF THE INVENTION

In accordance with the present invention, a 180° phase bit is provided by first and second oppositely poled series diodes having an approximately three-eighths wavelength transmission line segment connected from each junction thereof to a common junction which is, in turn, shunted to ground by a third diode. Operation is effected by the simultaneous forward or reverse biasing of the three diodes. When the diodes are forward biased, a radio frequency signal flows primarily through the series diodes thereby introducing a minimum phase shift in the signal. Alternatively, when the diodes are reverse biased, the radio frequency signal is caused to flow through the transmission line segments, thereby introducing a maximum phase shift in the signal. In the latter case, part of the signal also flows through the reverse biased series diodes. By adjusting the length and the impedance levels of the transmission line segments and the impedance of the series path, matched transmission can be achieved in both bias states. Transformer sections at the input and output can also be used to match at the bit. The amount of phase shift between the two bias states is adjusted by proper choice of diode reactances, impedance levels and transmission line lengths.

DESCRIPTION OF THE PREFERRED EMBODIMENTS

Figure 1:
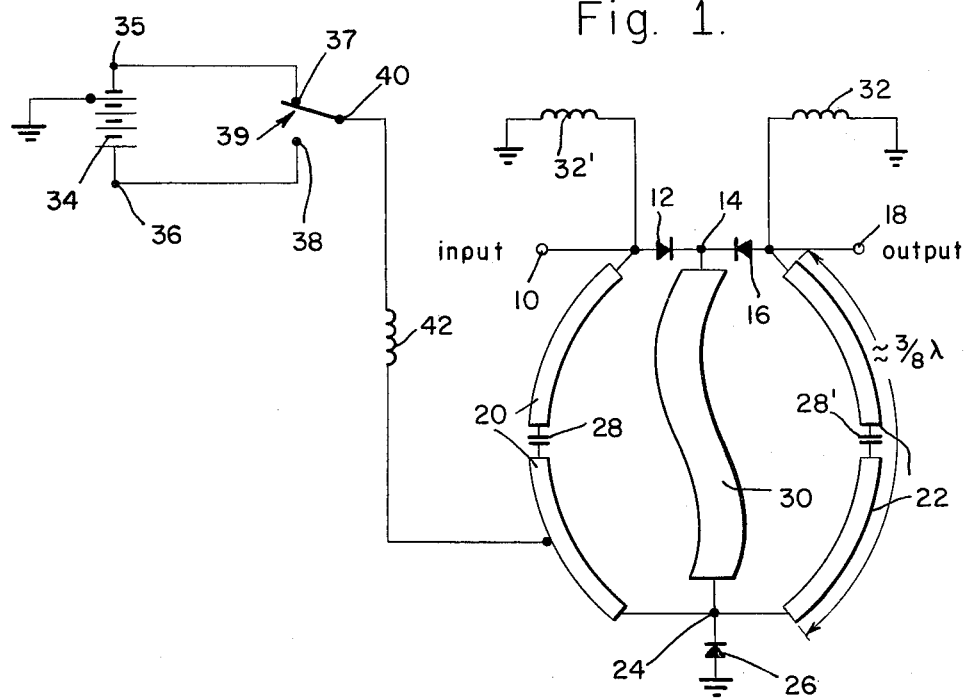
FIG. 1 illustrates a schematic microstrip circuit diagram of the 180° phase bit apparatus of the present invention.
Figure 2:
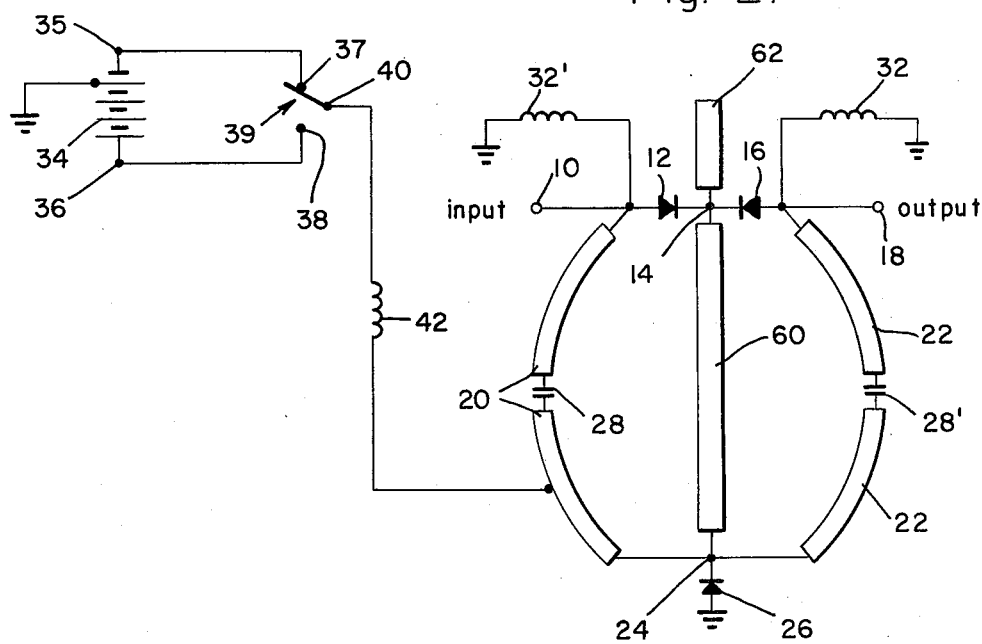
FIG. 2 illustrates a schematic microstrip circuit diagram of a 180° phase bit apparatus using a straight center leg in the device of FIG. 1. The electrical length of all three lines is made identical by adding a shunt open circuited stub to the common junction of the series diodes.

Referring to FIG. 1, there is depicted the 180° phase bit apparatus of the present invention. In particular, an input terminal 10 is connected through a series diode 12 to a junction 14 which, in turn, is connected through a series diode 16 to an output terminal 18, the diodes 12, 16 being poled to allow bias current flow in directions toward junction 14. In addition, three-eights wavelength segments of transmission lines 20, 22 are connected from input output terminals 10, 18, through blocking capacitors 28 and 28' to junction 24. Junction 24 is connected through a shunt diode 26 to ground and through a three-eights wavelength transmission line segment 30 to junction 14. Shunt diode 26 is poled in a direction to allow bias current flow towards the junction 24. Further, the input output terminals 10, 18 respectively are maintained at quiescent ground potential by means of radio frequency bias chokes 32 and 32' respectively connected therefrom to ground. The operation of the device of FIG. 1 is not critically dependent on the radio frequency parameters of the diodes 12, 16, 26 in that a wide range of diode parameters can be used to give radio frequency phase shift. By way of example, diodes with a capacitance of the order of 1.0 picofarads and a resistance of 0.25 ohm have been found to be satisfactory for S-band and L-band applications. Also, diodes with a capacitance of the order of 0.8 picofarad have been found to be satisfactory for C-band applications. The circuit operates over a wide frequency band. By way of example bandwidths of 20 to 30 percent have been achieved at S-band and C-band. It is also pointed out that transmission line segments 20, 22, 30 are all of substantially the same length. At low frequencies, this can be accomplished by configuring the center line 30 so that it has a serpentine shape as shown schematically in FIG. 1. At high frequencies, the length-to-width ratio of the center transmission line 30 prevents this in which case the line 30 is made physically shorter than the lines 20, 22 by capacitive shunt loading the junction 14 of the series diodes 12, 16 and the line 30 as shown in FIG. 2.

Biasing the 180° phase bit apparatus of the present invention is accomplished by maintaining the terminal 24 at an appropriate direct-current potential. The terminal 24 is directly connected to the cathodes of diodes 12, 16, 26 and is blocked from the anodes of diodes 12, 16 by blocking capacitors 28 and 28'. In each case, the anodes of diodes 12, 16, 26 are maintained at quiescent ground potential. Biasing apparatus includes, for example, a source of potential 34 which is referenced to ground so as to provide a potential of −0.75 volt at a negative terminal 35 and a potential of +100 volts at a positive terminal 36 thereof. Terminals 35, 36 of the source of potential 34 are connected to respective inputs 37, 38 of a double-throw single-pole switch 39 which, in turn, has an output 40 that is connected through a radio-frequency choke 42 to the transmission line 20. Position of the pole of switch 39 determines the bias applied to the diodes 12, 16, 26; i.e. when the single-pole of switch 39 is in contact with terminal 37 thereof, the diodes 12, 16, 26 are forward biased by +0.75 volt and when the single-pole of switch 39 is in contact with terminal 38 thereof, the diodes 12, 16, 26 are reverse biased by −100 volts.

Figure 3:
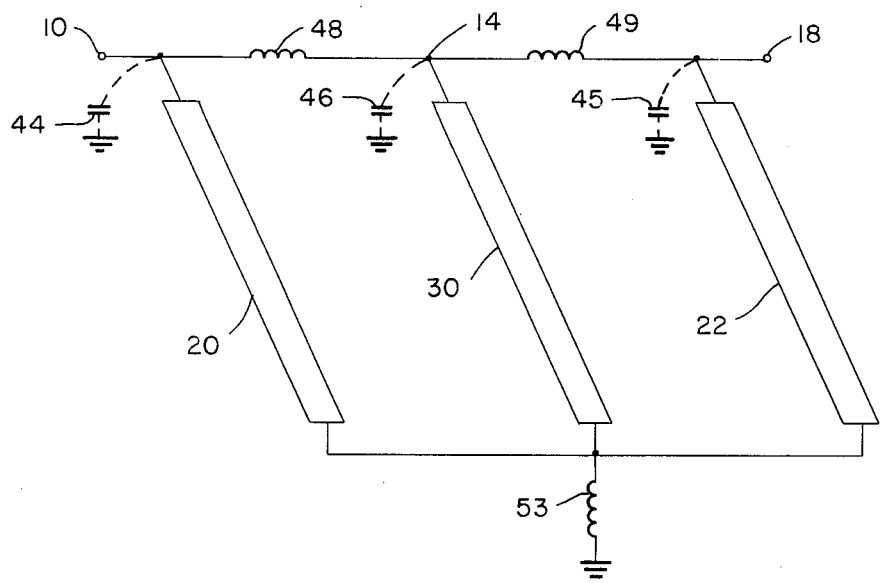
FIG. 3 shows the electrical equivalent circuit diagram of the apparatus of FIGS. 1 and 2 when the series and shunt diodes are all forward biased.

Referring to FIG. 3, there is shown the equivalent circuit of the apparatus of FIG. 1 when the diodes 12, 16, 26 are forward biased whereby bias current flows therethrough. Bias current flow through diode 26 effectively radio-frequency grounds junction 24 through the small inductor 53 whereby transmission line segments 20, 30, 22 reflect an impedance between infinity and zero to the input terminal 10, junction 14 and output terminal 18, respectively. Selection of the actual length and characteristic impedance of the transmission lines 20, 22, 30 will determine the magnitude and type of this impedance. It is generally known that a short at the end of a one-quarter wavelength transmission line generates a very high impedance (theoretically infinite) at the input and that a short at the end of a half wavelength transmission reflects a short at the input. Thus, a short or a small inductive reactance at the end of a three-eights wavelength transmission line generates an impedance at the input that is a capacitive reactance between these extremes illustrated by capacitance 44, 45, 46 connected from terminals 10, 18 and junction 14, respectively, to ground. The series diodes 12, 16 on the other hand, being forward biased, provide slightly inductive paths 48, 49 connecting the input, output terminals 10, 18 with the junction 14. With reference to FIG. 3, a radiofrequency signal applied to input terminal 10 divides with one part flowing through transmission line seqments 20, and a second part flowing through inductances 48 and 49. Since the inductive reactance of inductor 53 is very low typically approaching a radio frequency short circuit most of the input signal at terminal 10 flows directly through inductances 48 and 49 to terminal 18. Only a small part of the signal flows through transmission line segment 22 past inductance 53 and through transmission line segment 22 to output terminal 18. The capacitances 44, 45, 46 and inductances 48, 49 form a network which maintains proper impedance levels and produces phase shift between terminals 10 and 18.

Figure 4:
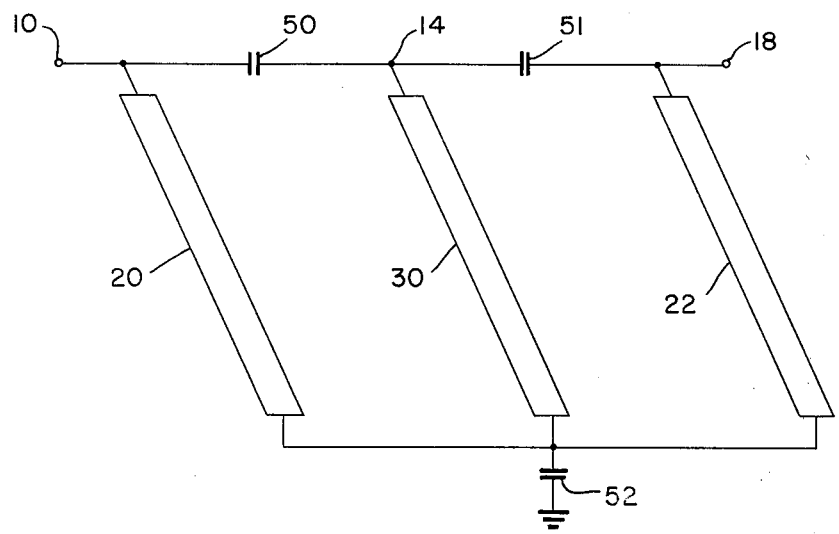
FIG. 4 shows the electrical equivalent circuit diagram of the apparatus of FIGS. 1 and 2 when the series and shunt diodes are all reverse biased.

Referring to FIG. 4, there is shown the equivalent circuit of the apparatus of FIG. 1 when the diodes 12, 16, 26 are reverse biased, i.e. when the single-pole of switch 39 is thrown so as to connect terminals 38 and 40 thereby reverse biasing the diodes 12, 16, 26 with −100 volts. Under these circumstances the diodes 12, 16, 26 present capacitances 50, 51, 52, respectively, to the radio-frequency signal. A radio-frequency signal applied to input terminal 10 divides with one part flowing through the transmission line segments 20, 22, another part flowing through transmission line segments 20, 30 and capacitance 51, and still another part flowing through capacitance 50 and transmission line segments 30, 22 to the output terminal 18. These signal parts recombine at terminal 18 to form an output signal. The net change in phase shift for the device is the difference in phase shift between terminals 10 and 18 when the diodes 12, 16, 26 are in forward and reverse bias. The 180° phase bit device described herein allows wide tolerance variation in diode 12, 16, 26 parameters since the phase shift is achieved primarily by proper choice of lengths of the transmission line segments 20, 22, 30 and impedance levels and is capable of operating over a bandwidth of the order of 20 to 30 percent. By proper choice of parameters of the diodes and transmission line segments, phase shifts from very low to comparatively high values (i.e. greater than 180°) can be achieved.

Referring to FIG. 2, there is shown the 180° phase bit circuit of FIG. 1 wherein the transmission line segment 30 has been replaced by a shorter but straight transmission line segment 60 together with a shunt open circuited transmission line stub 62 connected to junction 14. Other reference numerals refer to identical elements as described in connection with FIG. 1. The straight transmission line segment 60 together with stub 62 are particularly desirable at higher frequencies when implementing the device with strip line or microstrip. The open circuited stub 62 is chosen to produce the same effective length with transmission line segment 60 as was the transmission line segment 30 of the apparatus of FIG. 1 whereby the operation is the same.

What is claimed is:

1. An apparatus for selectively introducing a predetermined phase shift in a signal, said apparatus comprising an input terminal and an output terminal; a first unidirectionally conducting device connected from said input terminal to an intermediate junction; a second unidirectionally conducting device connected from said intermediate junction to said output terminal; first, second and third segments of transmission line connected from said input terminal, said intermediate terminal and said output terminal, respectively, to a common junction, said first, second and third segments of transmission line each being greater than one-quarter wavelength and less than one-half wavelength long at the frequency of said signal; a third unidirectionally conducting device connected from said common junction to a third junction maintained at a substantially fixed reference potential; and means coupled to said first, second and third unidirectionally conducting devices for simultaneously rendering said first, second and third devices conductive or non-conductive.

2. The apparatus for selectively introducing a predetermined phase shift in a signal wherein said predetermined phase shift is of the order of 180°.

3. An apparatus for selectively introducing a predetermined phase shift in a signal, said apparatus comprising an input terminal and an output terminal; a first unidirectionally conducting device connected from said input terminal to an intermediate junction; a second unidirectionally conducting device connected from said intermediate junction to said output terminal; first, second and third segments of transmission line connected from said input terminal, said intermediate terminal and said output terminal, respectively, to a common junction, said first, second and third segments of transmission line each being greater than one-quarter wavelength and less than one-half wavelength long at the frequency of said signal; a third unidirectionally conducting device connected from said common junction to a third junction maintained at a substantially fixed reference potential; and means coupled to said first, second and third unidirectionally conducting devices for selectively and simultaneously forward biasing or reverse biasing said first, second and third unidirectionally conducting devices thereby to selectively introduce said predetermined phase shift in said signal.

4. The apparatus for selectively introducing a predetermined phase shift in a signal as defined in claim 3 wherein each of said first, second and third segments of transmission line are of the order of three-eighths wavelength long at the frequency of said signal.

5. The apparatus for selectively introducing a predetermined phase shift in a signal as defined in claim 3 wherein each of said first and third segments of transmission line are of the order of three-eighths wavelength long at the frequency of said signal, said second segment of transmission line is disposed in a straight line configuration between said intermediate junction and said common junction; and additional means connected to said intermediate junction for making the effective electrical length of said second segment of transmission line equal to three-eighths wavelenth at the frequency of said signal.

6. The apparatus for selectively introducing a predetermined phase shift in a signal as defined in claim 5 wherein said additional means constitutes an open circuited stub segment of transmission line.

7. An apparatus for selectively introducing a predetermined phase shift in a signal, said apparatus comprising an input terminal and an output terminal; a first diode connected from said input terminal to an intermediate junction; a second diode connected from said intermediate junction to said output terminal; first, second and third segments of transmission line connected from said input terminal, said intermediate terminal and said output terminal, respectively, to a common junction, said first, second and third segments of transmission line each being greater than one-quarter wavelength and less than one-half wavelength long at the frequency of said signal; a third diode connected from said common junction to a third junction maintained at a substantially fixed reference potential; and means coupled to said first, second and third diodes for selectively and simultaneously forward biasing or reverse biasing said first, second and third diodes thereby to selectively introduce said predetermined phase shift in said signal.

8. An apparatus for selectively introducing a predetermined phase shift in a signal, said apparatus comprising an input terminal and an output terminal; a first diode connected from said input terminal to an intermediate junction; a second diode connected from said intermediate junction to said output terminal, said first and second diodes being poled to allow bias current to flow away toward said intermediate junction; first, second and third segments of transmission line connected from said input terminal, said intermediate junction and said output terminal, respectively, to a common junction, each of said first, second and third segments of transmission line being greater than one-quarter wavelength and less than one-half wavelength long at the frequency of said signal; a third diode connected from said common junction to ground, said third diode being poled to allow bias current to flow towards said common junction; means connected to said intermediate junction for maintaining said intermediate junction at quiescent ground potential; and means connected to the cathodes of said first, second and third diodes for selectively and simultaneously forward or reverse biasing said first, second and third diodes thereby to selectively introduce said predetermined phase shift in said signal.

9. The apparatus for selectively introducing a predetermined phase shift in a signal as defined in claim 8 wherein each of said first, second and third segments of transmission line is three-eighths wavelength long at the frequency of said signal.

10. The apparatus for selectively introducing a predetermined phase shift in a signal as defined in claim 8 wherein said first and third segments of transmission line are each three-eighths wavelength long at the frequency of said signal and said second segment of transmission line is disposed in a straight line configuration between said common junction and said intermediate junction; and means connected to said intermediate junction for making the electrical equivalent length of said second segment of transmission line equal to three-eighths wavelength long at the frequency of said signal.

* * * * *